(12) United States Patent
Beck et al.

(10) Patent No.: US 7,521,997 B2
(45) Date of Patent: Apr. 21, 2009

(54) LOW-POWER VARIABLE GAIN AMPLIFIER

(75) Inventors: Sung Ho Beck, Gyeonggi-do (KR); Myung Woon Hwang, Seoul (KR)

(73) Assignee: FCI Inc. (KR)

( * ) Notice: Subject to any disclaimer, the term of this patent is extended or adjusted under 35 U.S.C. 154(b) by 0 days.

(21) Appl. No.: 11/938,363

(22) Filed: Nov. 12, 2007

(65) Prior Publication Data

US 2008/0122540 A1 May 29, 2008

(30) Foreign Application Priority Data

Nov. 24, 2006 (KR) .................... 10-2006-0116705

(51) Int. Cl.
*H03F 3/45* (2006.01)
(52) U.S. Cl. .................. 330/254; 330/259; 330/261
(58) Field of Classification Search .............. 330/254, 330/259, 261
See application file for complete search history.

(56) References Cited

U.S. PATENT DOCUMENTS

| | | | | |
|---|---|---|---|---|
| 4,823,093 | A * | 4/1989 | Frey ............................ | 330/254 |
| 5,949,285 | A * | 9/1999 | Ando .......................... | 330/254 |
| 6,807,406 | B1 * | 10/2004 | Razavi et al. ................ | 455/313 |
| 6,972,624 | B1 * | 12/2005 | Stroet ......................... | 330/254 |
| 7,088,981 | B2 * | 8/2006 | Chang ......................... | 455/326 |
| 2005/0017784 | A1 * | 1/2005 | Takenaka .................... | 327/359 |

* cited by examiner

*Primary Examiner*—Patricia Nguyen
(74) *Attorney, Agent, or Firm*—Cantor Colburn LLP

(57) ABSTRACT

Provided is a low-power variable gain amplifier having a direct-current (DC) bias stabilizer. The low-power variable gain amplifier includes: a load block through which first and second load currents flow from a first source voltage; a first differential input signal source including a terminal connected to a second source voltage and the other terminal connected to a variable gain amplifying block and sinking currents corresponding to a value of a first differential input current signal; a second differential input signal source including a terminal connected to the second source voltage and the other terminal connected to the variable gain amplifying block and sinking currents corresponding to a value of a second differential input current signal; a variable gain amplifying block sinking first and second differential output current signals that are branch currents of the first and load currents, respectively, and first and second destructive-compensation current signals, in response to first and second gain control signals and the first and second differential input current signals; and the DC bias stabilizer processing the first and second destructive-compensation current signals and first and second bias currents that are branch currents of the first and second load currents, respectively, to enable the first and second load currents to include fixed DC current components, wherein the currents sunk to the first and second differential input signal sources include DC current components and AC current components, the DC current components of the first and second differential input signal sources have the same value, and the AC current components thereof have a phase difference of 180°.

8 Claims, 3 Drawing Sheets

LOW-POWER VARIABLE GAIN AMPLIFIER

CROSS-REFERENCE TO RELATED PATENT APPLICATION

This application claims the benefit of Korean Patent Application No. 10-2006-0116705, filed on Nov. 24, 2006 in the Korean Intellectual Property Office, the disclosure of which is incorporated herein in its entirety by reference.

BACKGROUND OF THE INVENTION

1. Field of the Invention

The present invention relates to a variable gain amplifier which is widely used for an analog integrated circuit in a communication system, and more particularly, to a low-power variable gain amplifier having a direct current (DC) bias stabilizer.

2. Description of the Related Art

A variable gain amplifier is used to maintain a strength of an output signal when a strength of an input signal is changed or change a strength of an output signal when a strength of an input signal is constant by changing a gain value.

FIG. 1 is a circuit diagram illustrating a conventional variable gain amplifier without a direct-current (DC) bias stabilization scheme.

Referring to FIG. 1, the variable gain amplifier 100 without the DC bias regulation scheme includes a variable gain amplifying unit 110, two load resistors 115 and 116, two differential input signal sources $I_{in+}$ and $I_{in-}$.

The first and second differential input signals $I_{in+}$ and $I_{in-}$ are defined by Equations 1 and 2.

$$I_{in+} = I_{DC} + I_{AC} \quad \text{[Equation 1]}$$

$$I_{in-} = I_{DC} - I_{AC} \quad \text{[Equation 2]}$$

Referring to Equations 1 and 2, the first and second differential input current signals $I_{in+}$ and $I_{in-}$ have the same DC current $I_{DC}$ and have alternating-currents (AC) $I_{AC}$ having a phase difference of 180°.

The AC currents $I_{AC}$ of the first and second differential input current signals $I_{in+}$ and $I_{in-}$ pass through the variable gain amplifying 110 including first, second, third, and fourth transistors 111, 112, 113, and 114 and are changed into voltages by the first and second resistors 115 and 116 that are the toad resistors to form first and second differential output voltage signals $V_{out+}$ and $V_{out-}$.

The sum of currents flowing through the first and second transistors 111 and 112 is the same as a current of the first differential input current signal $I_{in+}$. Similarly, the sum of currents flowing through the third and fourth transistors 113 and 114 is the same as a current of the second differential input current signal $I_{in-}$.

Voltage levels of the first and second gain control signals $V_{cp}$ and $V_{cn}$ that control an output gain determine currents flowing through the first to fourth transistors 111 to 114. Here, the current of the first differential output current signal $I_{out+}$ passing through the first transistor 111 determines the voltage level of the first differential output voltage signal $V_{out+}$, and the current of the second differential output current signal $I_{out-}$ passing through the fourth metal-oxide-semiconductor (MOS) transistor determines the voltage level of the second differential output voltage signal $V_{out-}$.

A gain k of the variable gain amplifier 110 is defined as a ratio of a current value of the first differential input current signal $I_{in+}$ to a current value of the first differential output current signal $I_{out+}$, or a ratio of a current value of the second differential input current signal $I_{in-}$ to a current value of the second differential output current signal $I_{out-}$. Therefore, as the currents flowing through the first and fourth transistors 111 and 114 increase, the gain increases, and this means that the voltage level of the first gain control signal $V_{cp}$ has to be higher than that of the second gain control signal $V_{cn}$.

The first and second differential output current signals $I_{out+}$ and $I_{out-}$ are represented by Equations 3 and 4 as follows.

$$I_{out+} = kI_{in+} = k(I_{DC} + I_{AC}) \quad \text{[Equation 3]}$$

$$I_{out-} = kI_{in-} = k(I_{DC} - I_{AC}) \quad \text{[Equation 4]}$$

The conventional variable gain amplifier illustrated in FIG. 1 has a problem in that the DC currents flowing through the first and second resistors 115 and 116 are changed, as the gain is changed by controlling the voltage levels of the first and second gain control signals $V_{cp}$ and $V_{cn}$. Therefore, a DC voltage dropped across the first and second resistors 115 and 116 is changed, and reference voltage levels of the two differential output voltage signals $V_{out+}$ and $V_{out-}$ output from the variable gain amplifier are changed.

In order to solve the problem, two capacitors 117 and 118 are used to transmit only an AC signal. However, there is another problem in that the low-frequency differential output voltage signals $V_{out+}$ and $V_{out-}$ are blocked by the capacitors so as not to be transmitted to a next function block.

In order to solve the problem, a variable gain amplifier using a DC bias stabilization scheme is proposed.

FIG. 2 is a circuit diagram illustrating a conventional variable gain amplifier having a DC bias stabilization scheme.

Referring to FIG. 2, the variable gain amplifier 200 having the DC bias stabilization scheme includes a second variable gain amplifying unit 220 having the same structure as that of a first variable gain amplifying unit 210. The second variable gain amplifier 220 is connected with two auxiliary current sources 250 and 260. A DC current that has the same value as the first and second differential input current signals $I_{in+}$ and $I_{in-}$ of the first variable gain amplifier 210 flows through the added two auxiliary current sources 250 and 260. However, an AC current does not flow therethrough.

The second variable gain amplifier 220 includes four transistors 221, 222, 223, and 224. Connection relationships between the four transistors 221, 222, 223, and 224 and the first and second gain control signals $V_{cp}$ and $V_{cn}$ are opposite to those of the first variable gain amplifier 210.

In a structure in which the two variable gain amplifiers 210 and 220 and the two gain control signals $V_{cp}$ and $V_{cn}$ are crossed and connected, when a voltage of the first gain control signal $V_{cp}$ increases, a DC current and an AC current that flow through the first and second resistors 215 to the first transistor 211 increases. However, the DC current and the AC current that flow to the eighth transistor 224 decreases. Here, only the DC current flows through the second auxiliary current source 250, so that only the DC current flows through the eighth transistor 224, and the AC current of the first differential output current signal $I_{out+}$ is not affected.

On the other hand, as the voltage of the first gain control signal $V_{cp}$ is decreased, the DC current and the AC current flowing from a first source voltage $V_{dd}$ through the first and second resistors 215 and 216 to the first transistor 211 decreases. However, the DC current and the AC current flowing through the eight transistor 224 increase.

As described above, a constant DC current flows through the first and second resistors 215 and 216, irrespective of the voltage of the first gain control signal $V_{cp}$, so that constant DC voltages of output nodes $V_{out+}$ and $V_{out-}$ are maintained.

However, the conventional variable gain amplifier 200 having the DC bias stabilization scheme illustrated in FIG. 2 requires two times the current of the conventional variable gain amplifier 100 illustrated in FIG. 1, so that relatively high power consumption is required. Therefore, the aforementioned scheme cannot be applied to a low-power apparatus.

SUMMARY OF THE INVENTION

The present invention provides a low-power variable gain amplifier capable of stabilizing a direct-current (DC) bias during gain variation.

According to an aspect of the present invention, there is provided a low-power variable gain amplifier including: a load block through which first and second load currents flow from a first source voltage; a first differential input signal source including a terminal connected to a second source voltage and the other terminal connected to a variable gain amplifying block and sinking currents corresponding to a value of a first differential input current signal; a second differential input signal source including a terminal connected to the second source voltage and the other terminal connected to the variable gain amplifying block and sinking currents corresponding to a value of a second differential input current signal; a variable gain amplifying block sinking first and second differential output current signals that are branch currents of the first and load currents, respectively, and first and second destructive-compensation current signals, in response to first and second gain control signals and the first and second differential input current signals; and a DC bias stabilizer processing the first and second destructive-compensation current signals and first and second bias currents that are branch currents of the first and second load currents, respectively, to enable the first and second load currents to include fixed DC current components, wherein the currents sunk to the first and second differential input signal sources include DC current components and AC current components, the DC current components of the first and second differential input signal sources have the same value, and the AC current components thereof have a phase difference of 180°.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the attached drawings. In the description, the detailed descriptions of well-known functions and structures may be omitted so as not to hinder the understanding of the present invention.

Figure 3:
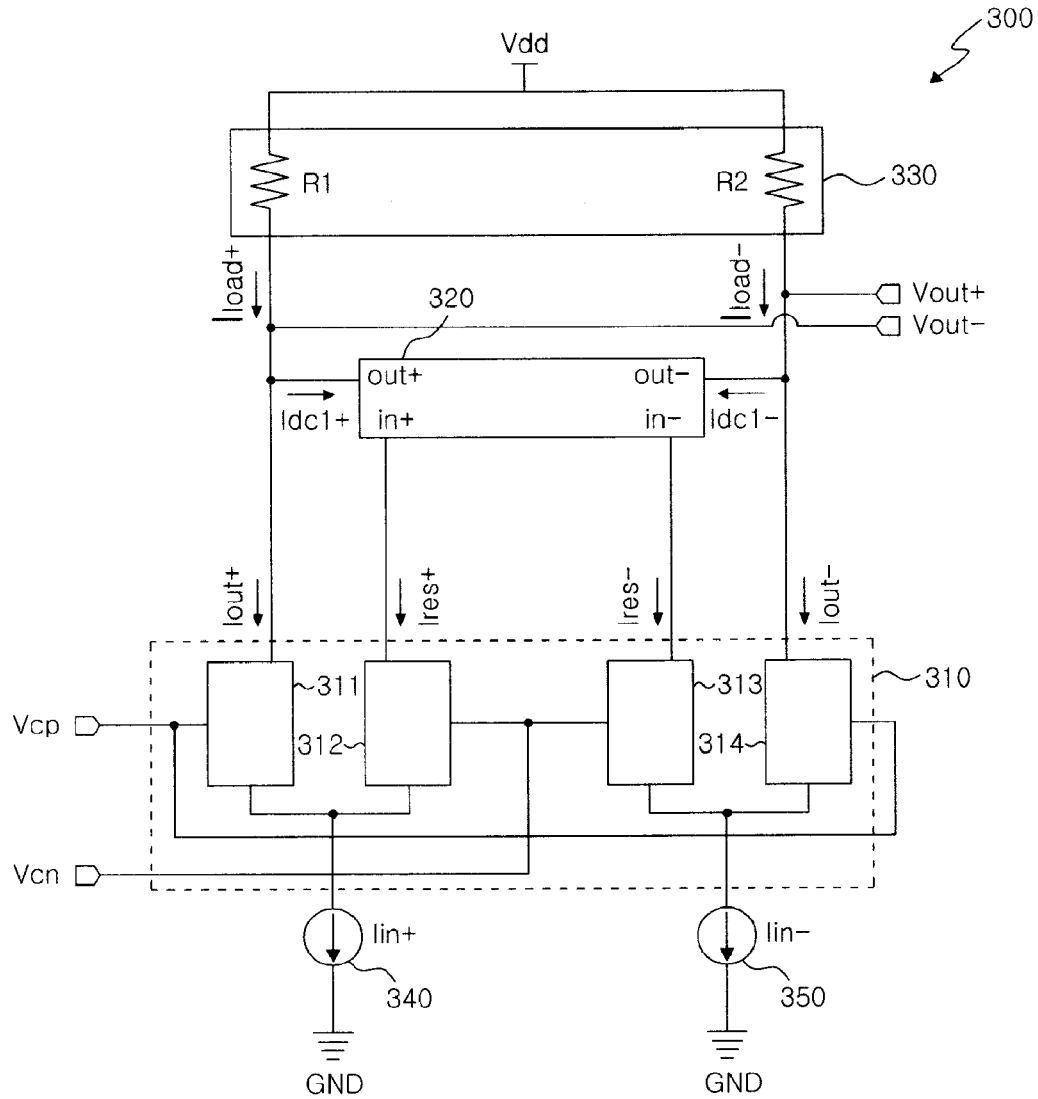
FIG. 3 is a circuit diagram illustrating a low-power variable gain amplifier according to an embodiment of the present invention.

FIG. 3 is a circuit diagram illustrating a low-power variable gain amplifier according to an embodiment of the present invention.

Referring to FIG. 3, the low-power variable gain amplifier 300 according to the embodiment of the present invention includes a variable gain amplifying block 310, a direct-current (DC) bias stabilizer 320, a load block 330, a first differential input signal source 340, and a second differential input signal source 350.

The variable gain amplifying block 310 "sinks" first and second differential output current signals $I_{out+}$ and $I_{out-}$ that are branch currents of first and second load currents $I_{load+}$ and $I_{load-}$ and first and second destructive-compensation current signals $I_{res+}$ and $I_{res-}$, in response to first and second gain control signals $V_{cp}$ and $V_{cn}$ and first and second differential input current signals $I_{in+}$ and $I_{in-}$.

The DC bias stabilizer 320 processes the first and second destructive-compensation current signals $I_{res+}$ and $I_{res-}$ and first and second bias currents $I_{DC1+}$ and $I_{DC1-}$ that are branch currents of the first and second load currents $I_{load+}$ and $I_{load-}$ so as to enable the first and second load currents $I_{load+}$ and $I_{load-}$ include only fixed DC current components.

The load block 330 generates first and second differential output voltage signals $V_{out+}$ and $V_{out-}$ by using the first and second load currents $I_{load+}$ and $I_{load-}$ flowing through the load block 330 from a first source voltage $V_{dd}$.

The first differential input signal source 340 sinks current corresponding to a value of the first differential input current signal $I_{in+}$ from the variable gain amplifying block 310. The second differential input signal source 350 sinks current corresponding to a value of the second differential input current signal $I_{in-}$ from the variable gain amplifying block 310.

Here, the currents sunk to the first and second differential input signal sources 340 and 350 include DC current components and AC current components. Amplitudes of the DC current components are the same and amplitudes the AC current components are the same. However, phases of the AC current components have a difference of 180°

Figure 1:
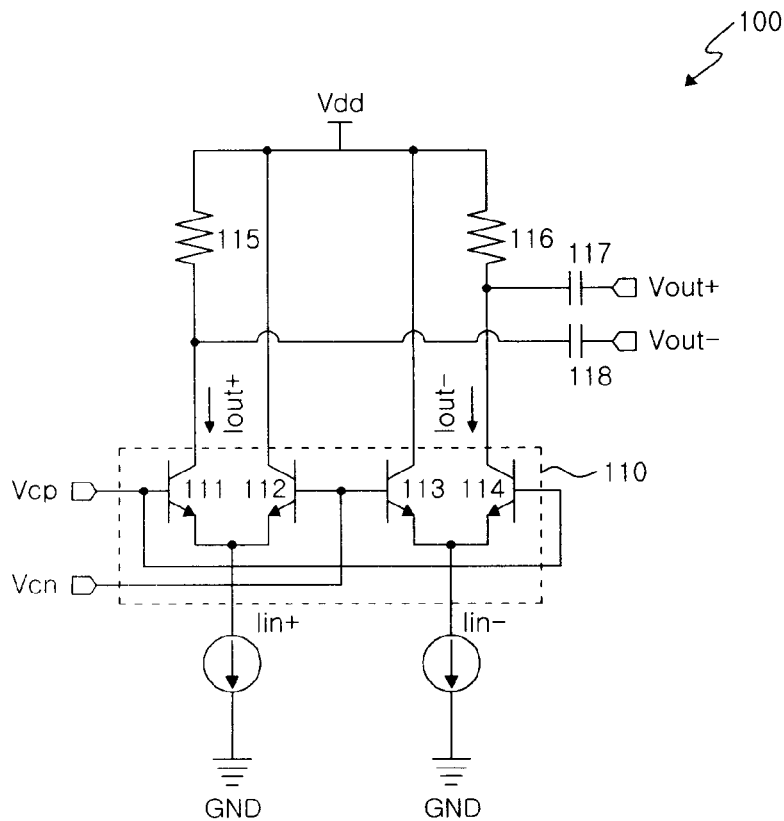
FIG. 1 is a circuit diagram illustrating a conventional variable gain amplifier without a direct-current (DC) bias stabilization scheme.
Figure 2:
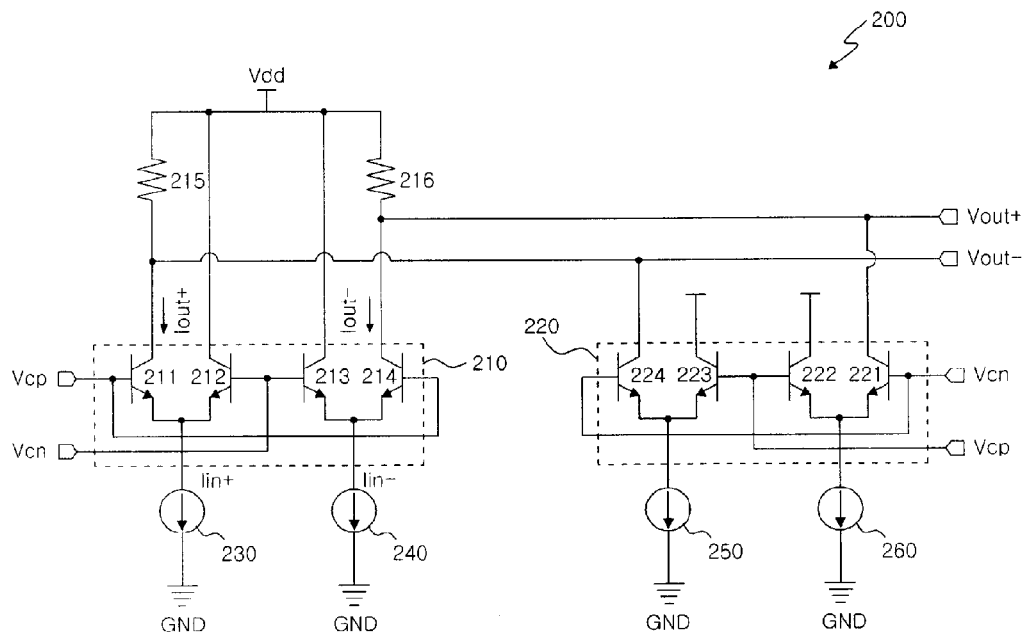
FIG. 2 is a circuit diagram illustrating a conventional variable gain amplifier having a DC bias stabilization scheme.

Here, the load block 330 may be implemented by using two resistors R1 and R2. In addition, four function blocks 311, 312, 313, and 314 included in the variable gain amplifying block 310 may be implemented by using four bipolar transistors as illustrated in FIG. 1 or metal-oxide semiconductor (MOS) transistors.

Now, operations of the low-power variable gain amplifier 300 according to the present invention will be described.

First, relationships between currents illustrated in FIG. 3 are described.

The first load current $I_{load+}$ flowing through the load block 300 is divided into the first differential output current signal $I_{out+}$ flowing to the variable gain amplifying block 310 and the first bias current $I_{DC1+}$ flowing to the DC bias stabilizer 320. Similarly, the second load current $I_{load-}$ flowing through the load block 300 is divided into the second differential output current signal $I_{out-}$ flowing to the variable gain amplifying block 310 and the second bias current $I_{DC1-}$ flowing to the DC bias stabilizer 320.

Referring to FIG. 3, the sum of a current of the first differential output current signal $I_{out+}$ and a current of the first destructive-compensation current signal $I_{res+}$ is the same as a current of the first differential input current signal $I_{in+}$. Similarly, the sum of a current of the second differential output current signal $I_{out-}$ and a current of the second destructive-compensation current signal $I_{res-}$ is the same as a current of the second differential input current signal $I_{in-}$.

The first and second differential input current signals $I_{in+}$ and $I_{in-}$ and the first and second differential output current signals $I_{out+}$ and $I_{out-}$ are defined in Equations 1 to 4 in advance and hereinafter use the same meanings as those defined Equations 1 to 4.

According to states of the first and second gain control signals $V_{cp}$ and $V_{cn}$, the currents of the first differential output current signal $I_{out+}$ and the first destructive-compensation current signal $I_{res+}$ are determined. Similarly, the currents of the second differential output current signal $I_{out-}$ and the second destructive-compensation current signal $I_{res-}$ are determined.

As described above, since the sum of the current of the first differential output current signal $I_{out+}$ and the current of the first destructive-compensation current signal $I_{res+}$ is the same as the total current of the first differential input current signal $I_{in+}$, as the current of the first differential output current signal $I_{out+}$ increases, the current of the first destructive-compensation current signal $I_{res+}$ decreases. On the contrary, as the current of the first differential output current signal $I_{out+}$ decreases, the current of the first destructive-compensation current signal $I_{res+}$ increases. Relationships between the second differential output current signal $I_{out-}$ and the second destructive-compensation current signal $I_{res-}$ are similar to those described above.

The first and second destructive-compensation current signals $I_{res+}$ and $I_{res-}$ can be defined by Equations 5 and 6 by using the relationships in Equations 1 to 4 and the above descriptions.

$$I_{res+}=I_{in+}-I_{out+}=(1-k)(I_{DC}+I_{AC}) \quad \text{[Equation 5]}$$

$$I_{res-}=I_{in-}-I_{out-}=(1-k)(I_{DC}-I_{AC}) \quad \text{[Equation 6]}$$

The variable gain amplifying block 310 and the DC bias stabilizer 320 may be designed to allow the two bias currents $I_{DC1+}$ and $I_{DC1-}$ input to the DC bias stabilizer 320 to have the same value. The above-mentioned assumption according to the present invention is considered to practically implement the DC bias stabilizer 320 illustrated in FIGS. 4 to 6, and a description thereof is provided later. Relationships between the two bias currents $I_{DC1+}$ and $I_{DC1-}$ and the first and second destructive-compensation current signals $I_{res+}$ and $I_{res-}$ are represented by Equation 7.

$$2I_{DC1+}=2I_{DC1-}=I_{res+}+I_{res-} \quad \text{[Equation 7]}$$

Since the two bias currents $I_{DC1+}$ and $I_{DC1-}$ have the same value, hereinafter, the two bias currents $I_{DC1+}$ and $I_{DC1-}$ are represented as $I_{DC1}$. The bias current $I_{DC1}$ input to the DC bias stabilizer 320 represented in Equations 5 to 7 may be represented by Equation 8.

$$I_{DC_1} = \frac{1}{2}(I_{res+} + I_{res-}) = (1-k)I_{DC} \quad \text{[Equation 8]}$$

Referring to Equation 8, in the bias current $I_{DC1}$, AC components included in the first and second destructive-compensation current signals $I_{res+}$ and $I_{res-}$ of the bias current $I_{DC1}$ cancel each other, and only DC components remain.

Relationships between the two load currents $I_{load+}$ and $I_{load-}$ flowing through the load block 330, the bias current $I_{DC1}$, and the two differential output current signals $I_{out+}$ and $I_{out-}$ are represented by Equation 9 and 10 by using Equations 3, 4, and 8.

$$I_{load+}=I_{out+}+I_{DC1}=I_{DC}+kI_{AC} \quad \text{[Equation 9]}$$

$$I_{load-}=I_{out-}+I_{DC1}=I_{DC}-kI_{AC} \quad \text{[Equation 10]}$$

The AC current components of the two load currents $I_{load+}$ and $I_{load-}$ flowing through the load block 330 are controlled by the gain value k that is changed according to the voltage levels of the first and second gain control signals $V_{cp}$ and $V_{cn}$ as shown in Equations 9 and 10. However, the DC current is constant regardless of the gain value k that is changed according to the first and second gain control signals $V_{cp}$ and $V_{cn}$.

As described above, the DC bias stabilizer 320 according to the embodiment of the present invention can maintain the DC current components of the two load currents $I_{load+}$ and $I_{load-}$ output from the load block 330 at constant values although the voltage levels of the first and second gain control signals $V_{cp}$ and $V_{cn}$ are changed.

Next, another object is to implement the DC bias stabilizer 320 that can satisfy electric characteristics represented in Equations 5 to 7.

Figure 4:
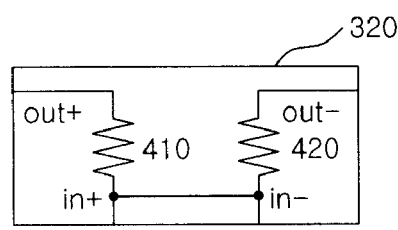
FIG. 4 is a view illustrating a DC bias stabilizer included in a low-power variable gain amplifier according to an embodiment of the present invention.

FIG. 4 is a view illustrating a DC bias stabilizer included in a low-power variable gain amplifier according to an embodiment of the present invention.

Referring to FIG. 4, the DC bias stabilizer 320 includes first and second bias resistors 410 and 420.

The first bias resistor 410 includes a terminal out+ connected to a node through which the first bias current $I_{DC1+}$ flows and the other terminal in+ connected to a node through which the first destructive-compensation current signal $I_{res+}$ flows. The second bias resistor 420 includes a terminal out− connected to a node through which the second bias current $I_{DC1-}$ flows and the other terminal in− connected to a node through which the second destructive-compensation current signal $I_{res-}$ flows. The node in+ through which the first destructive-compensation current signal $I_{res+}$ flows and the node in− through which the second destructive-compensation current signal $I_{res-}$ are connected to each other.

When the two bias resistors 410 and 420 are designed to have the same resistance value and the two function blocks 311 and 314 included in the variable gain amplifying block 310 are designed to have the same electric characteristics, the first and second bias currents $I_{DC1+}$ and $I_{DC1-}$ have the same value. In addition, since the node through which the first destructive-compensation current signal $I_{res+}$ flows and the node through which the second destructive-compensation current signal $I_{res-}$ flows are connected to each other, the AC signals which have a phase difference of 180° and are included in the first and second bias currents $I_{DC1+}$ and $I_{DC1-}$ so as to be transmitted through the first and second destructive-compensation current signals $I_{res+}$ and $I_{res-}$ cancel each other, and the DC signals are added to each other.

The added DC signal is divided into halves by the first and second bias resistors 410 and 420, so that the bias current signal $I_{DC1}$ represented in Equation 8 flows through the first and second destructive-compensation current signals $I_{res+}$ and $I_{res-}$, respectively. Referring to Equation 8, the bias current signal $I_{DC1}$ includes negative DC components that are changed according to the gain k, and referring to FIG. 3, the first differential output current signal $I_{out+}$ includes positive DC components that are changed according to the gain k. Referring to FIG. 9, since the first load current $I_{load+}$ is the sum of the bias current signal $I_{DC1}$ and the first differential output current signal $I_{out+}$, the negative DC components changed according to the gain k and the positive DC components changed according to the gain k cancel each other.

Therefore, the first and second load currents $I_{load+}$ and $I_{load-}$ output from the load block 330 can have only fixed DC current components that are not affected by the gain k.

Figure 5:
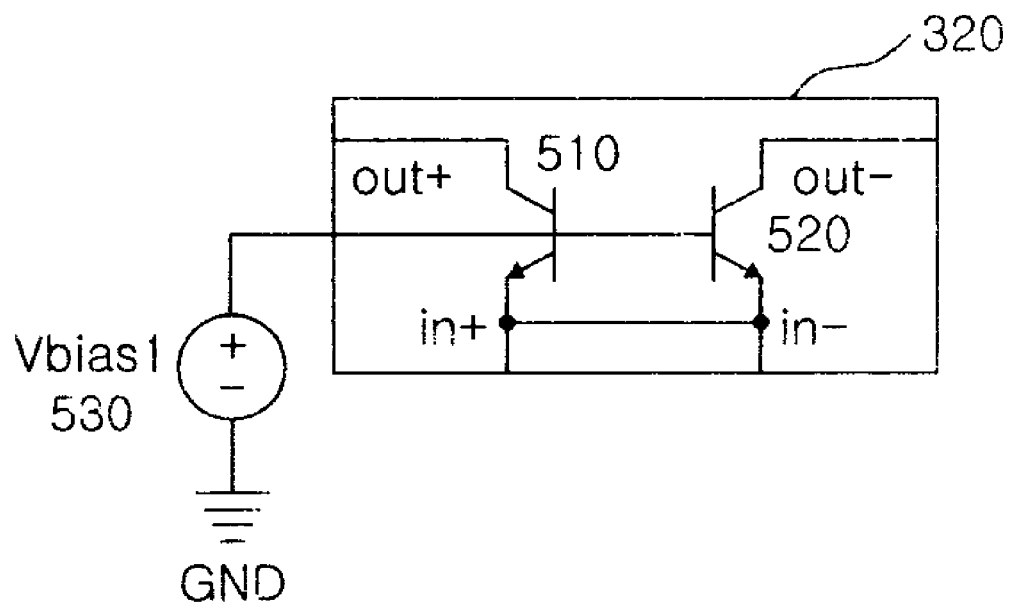
FIG. 5 is a view illustrating a DC bias stabilizer included in a low-power variable gain amplifier according to another embodiment of the present invention.

FIG. 5 is a view illustrating a DC bias stabilizer included in a low-power variable gain amplifier according to another embodiment of the present invention.

Referring to FIG. 5, the DC bias stabilizer 320 includes first and second bipolar transistors 510 and 520.

The first bipolar transistor 510 includes a terminal out+ connected to a node through which the first bias current $I_{DC1+}$ flows, the other terminal in+ connected to a node through which the first destructive-compensation current signal $I_{res+}$ flows, and a base terminal applied with a first bias voltage Vbias1. The second bipolar transistor 520 includes a terminal out- connected to a node through which the second bias current $I_{DC1-}$ flows, the other terminal in- connected to a node through which the second destructive-compensation current signal $I_{res-}$ flows, and a base terminal applied with the first bias voltage Vbias1. The node in+ through which the first destructive-compensation current signal $I_{res+}$ flows and the node in- through which the second destructive-compensation current signal $I_{res-}$ flows are connected to each other.

When the first and second bipolar transistors 510 and 520 are designed to have the same electric characteristics and the two function blocks 311 and 314 included in the variable gain amplifying block 310 are designed to have the same electric characteristics, the first and second bias currents $I_{DC1+}$ and $I_{DC1-}$ have the same value.

Since the node in+ through which the first destructive-compensation current signal $I_{res+}$ flows and the node in- through which the second destructive-compensation current signal $I_{res-}$ flows are connected to each other, the AC signals which have a phase difference of 180° and are included in the first and second bias currents $I_{DC1+}$ and $I_{DC1-}$ so as to be transmitted through the first and second destructive-compensation current signals $I_{res+}$ and $I_{res-}$ cancel each other, and the DC signals are added to each other.

The added DC signal is divided into halves by the first and second bipolar transistors 510 and 520, so that the bias current signal $I_{DC1}$ represented in Equation 8 flows through the first and second destructive-compensation current signals $I_{res+}$ and $I_{res-}$, respectively.

The DC bias stabilizer 320 implemented by using the bipolar transistors illustrated in FIG. 5 can have the same advantage as that described with reference to FIG. 4 in that the first and second load currents $I_{load+}$ and $I_{load-}$ output from the load block 330 can include only fixed DC current components that are not affected by the gain k.

The DC bias stabilizer 320 may further include a bias generator 530 for supplying the first bias voltage Vbias1.

Figure 6:
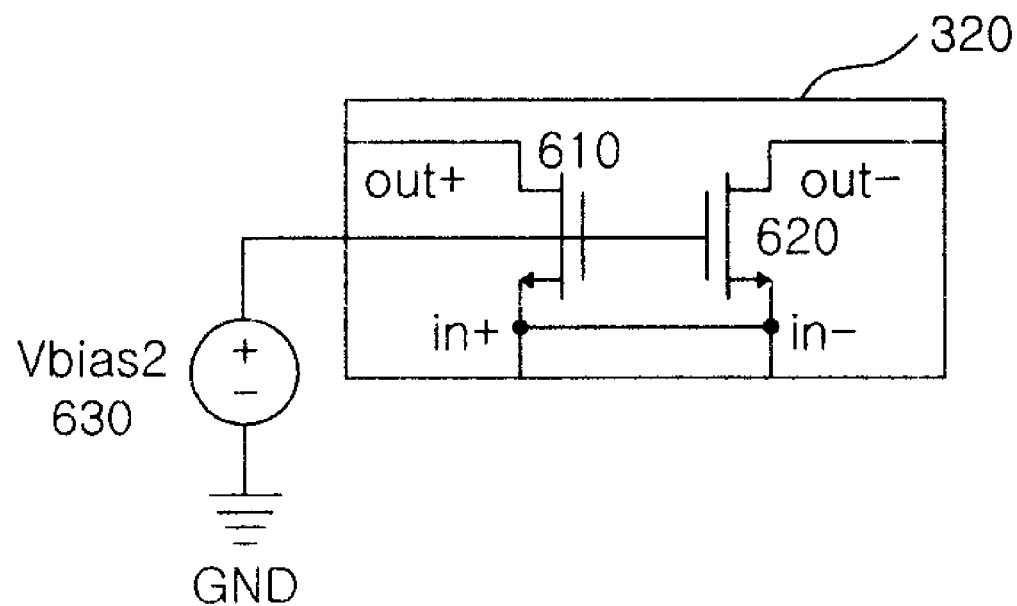
FIG. 6 is a view illustrating a DC bias stabilizer included in a low-power variable gain amplifier according to another embodiment of the present invention.

FIG. 6 is a view illustrating a DC bias stabilizer included in a low-power variable gain amplifier according to another embodiment of the present invention.

Referring to FIG. 6, the DC bias stabilizer 320 includes first and second MOS transistors 610 and 620.

The MOS transistor 610 includes a terminal out+ connected to a node through which the first bias current $I_{DC1+}$ flows, the other terminal in+ connected to a node through which the first destructive-compensation current signal $I_{res+}$ flows, and a gate terminal applied with a second bias voltage Vbias2. The second MOS transistor 620 includes a terminal out- connected to a node through which the second bias current $I_{DC1-}$ flows, the other terminal in- connected to a node through which the second destructive-compensation current signal $I_{res-}$ flows, and a gate terminal applied with the second bias voltage Vbias2. The node in+ through which the first destructive-compensation current signal $I_{res+}$ flows and the node in- through which the second destructive-compensation current signal $I_{res-}$ flows are connected to each other.

When the first and second MOS transistors 610 and 620 are designed to have the electric characteristics and the two function blocks 311 and 314 included in the variable gain amplifying block 310 are designed to have the same electric characteristics, the first and second bias currents $I_{DC1+}$ and $I_{DC1-}$ have the same value.

Since the node through which the first destructive-compensation current signal $I_{res+}$ flows and the node through which the second destructive-compensation current signal $I_{res-}$ flows are connected to each other, the AC signals which have a phase difference of 180° and are included in the first and second bias currents $I_{DC1+}$ and $I_{DC1-}$ so as to be transmitted through the first and second destructive-compensation current signals $I_{res+}$ and $I_{res-}$ cancel each other, and the DC signals are added to each other.

The added DC signal is divided into halves by the first and second MOS transistors 610 and 620, so that the bias current signal $I_{DC1}$ represented in Equation 8 flows through the first and second destructive-compensation current signals $I_{res+}$ and $I_{res-}$, respectively.

The DC bias stabilizer 320 implemented by using the MOS transistors illustrated in FIG. 6 can have the same advantage as that described with reference to FIGS. 4 and 5 in that the first and second load currents $I_{load+}$ and $I_{load-}$ output from the load block 330 can include only fixed DC current components that are not affected by the gain k.

The DC bias stabilizer 320 may further include a bias generator 630 for generating the second bias voltage Vbias2.

As described above, the low-power variable gain amplifier according to the embodiments of the present invention includes the DC bias stabilizer which processes differential input signals having DC currents having the same value and AC currents having a phase difference of 180° to cancel the AC components of the differential input signals and supply DC currents to output terminals so that the DC currents flowing through the load block are maintained at constant values irrespective of the gain of the amplifier. Therefore, the variable gain amplifier has an advantage of stabilizing the DC bias without consuming additional currents.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A low-power variable gain amplifier comprising:
   a load block through which first and second load currents flow from a first source voltage;
   a first differential input signal source including a terminal connected to a second source voltage and the other terminal connected to a variable gain amplifying block and sinking currents corresponding to a value of a first differential input current signal;
   a second differential input signal source including a terminal connected to the second source voltage and the other terminal connected to the variable gain amplifying block and sinking currents corresponding to a value of a second differential input current signal;
a variable gain amplifying block sinking first and second differential output current signals that are branch currents of the first and second load currents, respectively, and first and second destructive-compensation current signals, in response to first and second gain control signals and the first and second differential input current signals; and
a DC (direct-current) bias stabilizer processing the first and second destructive-compensation current signals and first and second bias currents that are branch currents of the first and second load currents, respectively, to enable the first and second load currents to include fixed DC current components,
wherein the currents sunk to the first and second differential input signal sources include DC current components and AC current components, the DC current components of the first and second differential input signal sources have the same value, and the AC current components thereof have a phase difference of 180°.

2. The low-power variable gain amplifier of claim 1, wherein the variable gain amplifying block comprises:
a first bipolar transistor including a terminal sinking the first differential output current signal, the other terminal connected to the other terminal of the first differential input signal source, and a base terminal applied with the first gain control signal;
a second bipolar transistor including a terminal sinking the first destructive-compensation current signal, the other terminal connected to the other terminal of the first differential input signal source, and a base terminal applied with the second gain control signal;
a third bipolar transistor including a terminal sinking the first destructive-compensation current signal, the other terminal connected to the other terminal of the second differential input signal source, and a base terminal applied with the second gain control signal; and
a fourth bipolar transistor including a terminal sinking the second differential output current signal, the other terminal connected to the other terminal of the second differential input signal source, and a base terminal applied with the first gain control signal.

3. The low-power variable gain amplifier of claim 1, wherein the variable gain amplifying block comprises:
a first MOS (metal-oxide-semiconductor) transistor including a terminal sinking the first differential output current signal, the other terminal connected to the other terminal of the first differential input signal source, and a gate terminal applied with the first gain control signal;
a second MOS transistor including a terminal sinking the first destructive-compensation current signal, the other terminal connected to the other terminal of the first differential input signal source, and a gate terminal applied with the second gain control signal,
a third MOS transistor including a terminal sinking the first destructive-compensation current signal, the other terminal connected to the other terminal of the second differential input signal source, and a gate terminal applied with the second gain control signal; and a fourth MOS transistor including a terminal sinking the second differential output current signal, the other terminal connected to the other terminal of the second differential input signal source, and a gate terminal applied with the first gain control signal.

4. The low-power variable gain amplifier of claim 1, wherein the DC bias stabilizer comprises:
a first bias resistor including a terminal connected to a node through which the first bias current flows and the other terminal through which the first destructive-compensation current signal flows; and
a second bias resistor including a terminal connected to a node through which the second bias current flows and the other terminal through which the second destructive-compensation current signal flows, and
wherein the node through which the first destructive-compensation current signal flows and the node through which the second destructive-compensation current signal flows are connected to each other.

5. The low-power variable gain amplifier of claim 1, wherein the DC bias stabilizer comprises:
a first bias bipolar transistor including a terminal connected to a node through which the first bias current flows, the other terminal through which the first destructive-compensation current signal flows, and a base terminal applied with a bias voltage; and
a second bias bipolar transistor including a terminal connected to a node through which the second bias current flows, the other terminal through which the second destructive-compensation current signal flows, and a base terminal applied with the bias voltage, and
wherein the node through which the first destructive-compensation current signal flows and the node through which the second destructive-compensation current signal flows are connected to each other.

6. The low-power variable gain amplifier of claim 5, wherein the DC bias stabilizer further comprises a bias generator generating the bias voltage.

7. The low-power variable gain amplifier of claim 5, wherein the DC bias stabilizer comprises:
a first bias MOS transistor including a terminal connected to a node through which the first bias current flows, the other terminal connected to a node through which the first destructive-compensation current signal flows, and a gate terminal applied with a bias voltage; and
a second bias MOS transistor including a terminal connected to a node through which the second bias current flows, the other terminal connected to a node through which the second destructive-compensation current signal flows, and a gate terminal applied with the bias voltage, and
wherein the node through which the first destructive-compensation current signal flows and the node through which the second destructive-compensation current signal flows are connected to each other.

8. The low-power variable gain amplifier of claim 5, wherein the DC bias stabilizer further comprises a bias generator generating the bias voltage.

* * * * *